United States Patent [19]

Baur

[11] 3,996,512
[45] Dec. 7, 1976

[54] CONTAINER FOR RECEIVING AN INSULATING OR COOLING MEDIUM FOR ELECTRICAL APPARATUS TO BE TESTED FOR RESISTANCE TO ELECTRICAL BREAKDOWN

[76] Inventor: Josef Baur, No. 272, 6832 Sulz (Vorarlberg), Austria

[22] Filed: Apr. 10, 1975

[21] Appl. No.: 566,906

[30] Foreign Application Priority Data

Apr. 19, 1974  Austria .............................. 3284/74

[52] U.S. Cl. ............................................. 324/61 P
[51] Int. Cl.² ...................................... G01R 27/26
[58] Field of Search ................ 324/61 P, 61 R, 17; 317/246

[56] References Cited
UNITED STATES PATENTS

| | | | |
|---|---|---|---|
| 1,870,282 | 8/1932 | Cover .............................. | 324/61 R |
| 1,960,168 | 5/1934 | Schoenberg ..................... | 324/61 R |
| 2,836,792 | 5/1958 | Weber ............................. | 324/61 R |
| 3,250,207 | 5/1966 | Moyle et al. .................... | 324/61 P |
| 3,250,685 | 5/1966 | Graham ........................... | 324/61 P |
| 3,478,589 | 11/1969 | Birken ........................... | 324/61 R X |
| 3,937,164 | 5/1962 | Doble et al. .................... | 317/246 X |

*Primary Examiner*—Stanley T. Krawczewicz
*Attorney, Agent, or Firm*—Hans Berman

[57] ABSTRACT

A cylindrical container for receiving an insulating or cooling medium for electrical apparatus to be tested for resistance to electrical breakdown. The medium enters and leaves the container through two valved apertures. Closure members are fluid-tightly mounted over the two ends of the container, and a pair of electrodes are arranged in the container to form a spark gap therebetween extending parallel to, or coaxially with, the longitudinal axis of the container. Each electrode is carried by a rod held in a respective closure member and a test voltage is applied to the electrodes from the outside through the electrode rods.

10 Claims, 2 Drawing Figures

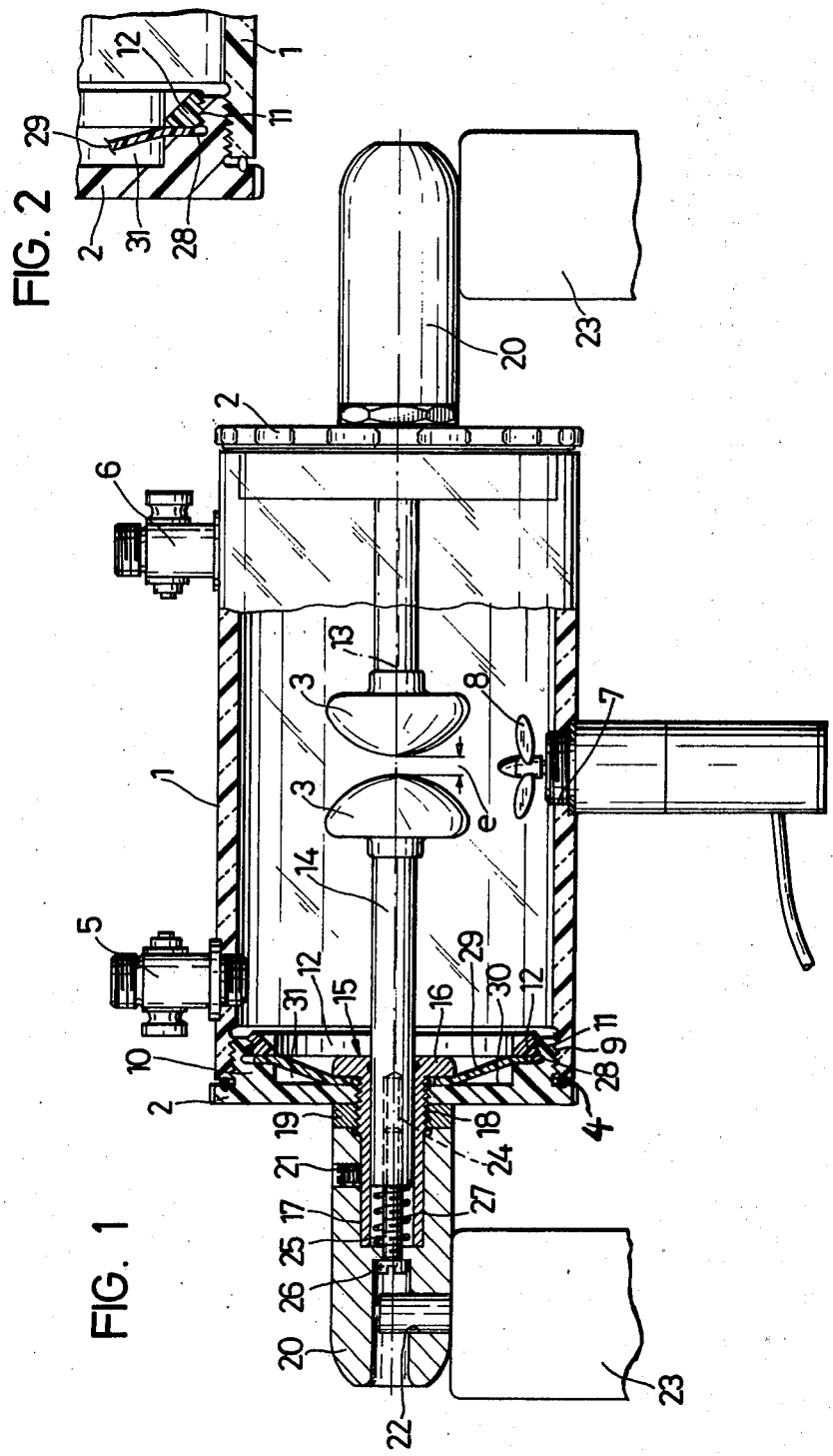

CONTAINER FOR RECEIVING AN INSULATING OR COOLING MEDIUM FOR ELECTRICAL APPARATUS TO BE TESTED FOR RESISTANCE TO ELECTRICAL BREAKDOWN

The present invention relates to improvements in a container for receiving an insulating or cooling fluid medium for electrical apparatus, such as transformers, converters, transducers, switches and the like, to be tested for resistance to electrical breakdown.

Containers of this type comprise a tubular element, preferably of cylindrical cross section and formed at least partially of a transparent material, having a longitudinal axis and two ends. The tubular element has an inlet and an outlet, and valves are mounted in the inlet and outlet for selectively opening and closing them to permit the medium to enter and leave the tubular element. A pair of electrodes in the tubular element are arranged to form a spark gap therebetween extending in the direction of the longitudinal axis, i.e. parallel thereto or coaxial therewith. Respective closure members are mounted over the two ends of the tubular element and fluid-tightly close the tubular element ends.

According to prevailing regulations for testing the resistance of electrically insulating media, such as insulating and cooling oils, to electrical breakdown, the insulating medium of a transformer, for example, is removed from the transformer housing through an opened faucet near the bottom of the housing and is poured into a wide-necked flask. The stream of oil flows freely through the surrounding atmosphere from the faucet into the flask. Such flasks usually have a volume of about 1 to 2 liters and the oil to be tested is transported — often over long distances — in the flask to the test laboratory. At the laboratory, the oil is again poured from the flask into the receptacle of the test apparatus in a stream passing through the ambient atmosphere. The regulations provide for the use of the transport flask and the test receptacle in absolutely dry condition. Any residual moisture on the walls of the flask and receptacle must be removed by rinsing them with the oil to be tested to reduce any remaining moisture and dirt to a minimum. This is necessary because these oils are exceedingly hygroscopic and thus absorb moisture from the surrounding air, and even minor moisture contents considerably reduce the resistance of the medium to electrical breakdown. Since the medium passes through the atmosphere while being poured into and out of the transport flask, occlusion of some gas particles from the air is practically unavoidable.

It is known to measure the dielectric resistance of insulating oils of transformers, oil switches and other electrical apparatus by means of a test spark gap and with the use of an independent and adjustable test voltage. In the known test device, the test spark gap may be arranged in the casing of the apparatus or in the instrument which is fixedly mounted on the apparatus and through which the oil passes, the terminals for the test voltage being accessible from the outside. To enable burned portions of the tested oil to be removed from the electrode chambers, a valved outlet is provided on the casing. The casing with the test spark gap forms a fixed part of the apparatus.

U.S. Pat. No. 1,870,282 discloses a test device for oil, which consists of plate electrodes defining a test spark gap therebetween. These plate electrodes are affixed to discs mounted in a glass cylinder. The ends of the glass cylinder are closed by covers defining central apertures through which the medium to be tested enters and leaves the cylinder. Rods are arranged close to the inner wall of the cylinder and parallel to the cylinder axis, the rods being staggered in a circumferential direction and slidingly carrying the electrode disc. The discs also carry contact lugs in electrically conducting contact with terminals receiving a test voltage. The terminals are diametrically oppositely positioned in the cylinder wall.

A device of this type has a number of disadvantages. It must be taken apart when it is desired to adjust the test spark gap. After the device has been assembled, the adjusted spark gap can no longer be controlled. Complex armatures are required to hold the covers in fluid-tight engagement with the cylinder ends. In view of the diametrical positioning of the terminals, it is not possible to use test voltages of any magnitude.

It is the primary object of this invention to provide a transportable test container of the first-indicated type, which enables various electrical apparatus to be tested with a spark gap in the container, filling of the container being effected without exposing the tested oil to air.

It is another object of the invention to provide a container of simple construction which avoids the disadvantages of known devices and is readily cleaned.

The above and other objects and advantages are accomplished in accordance with the present invention by providing an electrode rod carrying a respective one of the electrodes and held in a respective one of the closure members. Each electrode rod passes from the inside to the outside of the tubular element whereby the closure members serve as holders for the electrodes. A source of test voltage is provided for each electrode and the test voltage is applied to the electrodes from the source through the electrode rods.

The above and other objects, advantages and features of this invention will become more apparent from the following detailed description of a now preferred embodiment thereof, taken in conjunction with the accompanying drawing wherein:

FIG. 1 is a partial longitudinal section of the container, the right side being shown in an elevational side view and being identical with the left side shown in section; and FIG. 2 is a sectional view of a detail.

Referring now to the drawing, the container is illustrated as consisting of a cylindrical tubular element 1 of uniform cross section having longitudinal axis 13 and two open, axial ends. The preferred material for tubular container 1 is a transparent synthetic resin, such as Plexiglas, or glass, for example. Closure members 2 are mounted over the two ends and fluid-tightly close the ends. According to this invention, the closure members serve as holders for a pair of electrodes 3, 3 in tubular element 1.

The wall of the tubular element defines inlet and outlet apertures positioned adjacent the respective ends of the tubular element, valves 5 and 6 being mounted in the inlet and outlet for selectively opening and closing them so as to enable a fluid medium to be tested to be delivered into the container and to be removed therefrom without exposure to air. While the inlet and outlet are positioned on the same side of the container in the illustrated embodiment, they could be arranged diametrically opposed or in any other suitable array.

An aperture 7 in the container wall, which is preferably arranged centrally between the ends of the container, holds a motor-driven agitating device 8 so as to stir the medium during testing.

Internal threads 9 are provided at each end of tubular element 1 to engage with the correspondingly externally threaded skirt 10 of closure members 2. Fluid-tight gasket 4 is shown mounted between annular flange of the closure member extending beyond skirt 10 and the adjacent rim of tubular element 1. The skirt has an internally threaded flange 11 for threaded engagement with clamping ring 12.

In the illustrated embodiment, the axis of the spark gap between electrodes 3, 3 is coaxial with longitudinal axis 13 of container 1. However, if desired, the two axes may be spacedly parallel to each other, i.e. the electrodes may be eccentrically mounted.

Each electrode is carried by rod 14 held in a respective one of closure members 2, 2. The illustrated mounting for the electrode rod comprises bushing 15 inserted through a threaded central bore in the closure member and coaxial with the longitudinal axis of tubular element 1. The electrode rod passes through an axial bore in the bushing and is held therein. The bushing has tubular stem 17 and collar 16 at one end of the stem, stem 17 having threaded portion 18 adjacent collar 16. Nut 19 threadedly engages threaded stem portion 18, closure member 2 being held between collar 16 and nut 19.

Contact element 20, which has been illustrated as a cylindrical member, is mounted on the outwardly extending bushing stem and is fixed to the stem by headless screw 21 extending through the contact element transversely to the longitudinal axis. Near the outer end of the contact element it has a transverse bore 22 which serves to receive a test voltage carrying electrode 23 of a test apparatus (not shown) otherwise which constitutes a source of test voltage. In this manner, the container of the present invention may be simply and releasably mounted on the test apparatus by plugging the test electrode into bore 22.

The end of rod 14 remote from electrode 3 defines threaded axial bore 24, and metallic contact element 20 defines a bore coaxial with bushing 15. The contact element has an annular shoulder at the end of its bore adjacent the end of the bushing opposite collar 16 and set screw 25 has head 26 and is threadedly engaged with threaded axial bore 24, the head of the set screw extending into the bore of the metallic contact element and engaging the annular shoulder thereof. Coil spring 27 surrounds the set screw and is mounted between the remote end of the electrode rod and the annular shoulder. If desired, the set screw may be a micrometer screw enabling distance $e$ between the electrodes 3, 3 to be adjusted most accurately simply by turning the set screw from the outside and without disassembling the device. The adjustment may be read from a scale associated with the micrometer screw.

Internal shoulder 28 in skirt 10 is axially spaced from the surface of collar 16 adjacent closure member 2. Annular membrane 29 is clamped between shoulder 28 and ring 12, on the one hand, and collar 16 and inner surface 30 of closure member 2, on the other hand, the membrane defining chamber 31 with closure member surface 30.

In operation, tubular element 1 is filled with oil or any other insulating or cooling medium to be tested through valved aperture 5. The spark gap defined by distance $e$ is adjusted by turning the screw head 26. Chamber 31 serves to adjust the volume of the test chamber in the container when the oil filling the chamber expands or contracts due to temperature changes. However, the device will function without this chamber, and membrane 29 may, therefore, be omitted. Also, if the electrode spacing is not adjusted by means of a micrometer, it may be simply tested by removing the stirrer 8 and inserting thereinstead a gage for measuring the electrode distance. In view of the threaded engagement, this replacement is most readily effected. Also, if membrane 29 is omitted, valved inlet 5 and outlet 6 may be defined in closure members 2, 2 instead of the wall of the tubular element 1. While the tubular element described herein is a cylinder, it may have any suitable cross section, i.e. it may be polygonal. In this case, however, it would not be possible to provide a fluid-tight connection between closure member 2, 2 and tubular element 1 by threaded connections.

It will be obvious from the above description that the container may be disassembled in the simplest manner possible, simply by unscrewing the two end enclosures manually and axially withdrawing the electrodes 3 together with the closure members 2 from the tubular element 1 to make all parts readily accessible for cleaning. The adjustment of the spark gap length also is possible with the simplest means. Volume changes in the liquid medium being tested, due to variations in the temperature, can be accommodated by the container without undue stresses. While the threaded bores in the container wall for receiving valves 5 and 6, on the one hand, and stirrer 8, on the other hand, have been shown displaced by 180°, other spacings may be used. If test voltages of different magnitude are to be used, this may be done simply by changing no more than the tubular element, using such elements of different lengths while the closure members and the electrodes carried thereby remain unchanged. If desired, the inner surfaces 30 of closure members 2 could be cup-shaped, such arcuate configuration improving the streamlining of the interior of the container for a proper flow of the medium to be tested.

Regulations for testing of insulating media for electrical apparatus provide to remove large amounts of the medium from the casing of the apparatus and to rinse the test container therewith. The construction of the container according to the present invention makes it possible to tap the casing by means of a hose connected directly to the valved inlet of the container and without exposing the medium to the air while the valved outlet of the container remains open. In this manner, the interior of the container will be flushed with the medium coming from the casing of the apparatus and flowing through the container. After flushing, the outlet valve is closed until the container is filled with the medium to be tested, whereupon the inlet valve is closed, too, and testing may begin. Thus, the medium will never be in contact with the air and the medium tested in the container will always be identical with the medium in the casing of the electrical apparatus from which it has been taken for testing.

What is claimed is:
1. A container for testing a fluid medium for resistance to electrical breakdown comprising:
   a. a tubular element having an axis and two open, axial ends;
   b. two closure elements releasably fastened to said tubular element in fluid-tight engagement and clos- ing said open ends, an inlet aperture and an outlet aperture being formed in at least one of said elements;

c. two valves respectively mounted in said apertures for opening and closing the same.

d. an electrode rod mounted on each closure element, said electrode rod passing axially through the associated closure member and having respective portions in said tubular element and outside the tubular element;

e. two electrodes mounted on respective portions of said electrode rods in said tubular element in axially spaced relationship and defining a spark gap therebetween; and f. means for applying a test voltage to said electrodes through said electrode rods, said electrodes being dimensioned for axial movement through said open ends while connected to said closure elements by said electrode rods.

2. The container of claim 1, wherein said tubular element is of substantially uniform cross section.

3. The container of claim 1, wherein the tubular element is of cylindrical cross section.

4. The container of claim 1, wherein the inlet and outlet apertures are formed adjacent the respective ends in the tubular element.

5. The container of claim 1, wherein the closure elements are threadedly engaged with the tubular element.

6. The container of claim 1, further comprising a bushing inserted into each of the closure elements and coaxial with the longitudinal axis of the tubular element, a respective one of the electrode rods being held in each of the bushings, the bushing having a stem and a collar at one end of the stem, a threaded portion on the stem adjacent the collar, and a nut threadedly engaging the threaded stem portion, each of the closure elements being held between the collar and nut.

7. The container of claim 6, wherein the means for applying the test voltage comprises a metallic contact element mounted on each of the bushing stems, and further comprising means for fixing the contact element on the bushing stem.

8. The container of claim 7, wherein the fixing means comprises a headless screw extending through the contact element transversely to the longitudinal axis.

9. The container of claim 7, wherein the metallic contact element defines a transverse bore adapted to receive a voltage carrying electrode of a test apparatus.

10. The container of claim 7, wherein at least one of the electrode rods defines a threaded axial bore at an end of the rod remote from the electrode carried thereby, the metallic contact element defining a bore coaxial with the bushing, an annular shoulder at the end of the bore in the metallic contact element adjacent the end of the bushing opposite to the one end thereof, a set screw having a head threadedly engaged with the threaded axial bore, the head of the set screw extending into the bore in the metallic contact element and engaging the annular shoulder, and a compression spring surrounding the set screw and mounted between the remote end of the electrode rod and the annular shoulder.

* * * * *